United States Patent [19]
Takatsuji et al.

[11] Patent Number: 6,091,151
[45] Date of Patent: Jul. 18, 2000

[54] WIRING LAYER AND METHOD OF FORMING THE WIRING LAYER

[75] Inventors: Hiroshi Takatsuji, Shiga-ken; Satoshi Tsuji, Hadano; Hiroaki Kitahara, Shiga-ken, all of Japan

[73] Assignee: International Business Machines Corporation, Armonk, N.Y.

[21] Appl. No.: 08/852,823

[22] Filed: May 7, 1997

[30] Foreign Application Priority Data

Oct. 9, 1996 [JP] Japan ..................................... 8-287695

[51] Int. Cl.$^7$ .......................... H01L 31/036; A01L 23/48
[52] U.S. Cl. ............................. 257/765; 257/771; 257/51
[58] Field of Search ............................. 257/72, 762, 76, 257/771, 52

[56] References Cited

U.S. PATENT DOCUMENTS

| | | | |
|---|---|---|---|
| 4,899,206 | 2/1990 | Sakurai et al. ............................. | 357/67 |
| 5,107,355 | 4/1992 | Satoh et al. ................................. | 359/87 |
| 5,148,259 | 9/1992 | Kato et al. .................................. | 357/67 |
| 5,406,121 | 4/1995 | Toyoda ....................................... | 257/740 |
| 5,541,007 | 7/1996 | Ueda et al. ............................. | 428/650 |

*Primary Examiner*—Frank G. Font
*Assistant Examiner*—Zandra V. Smith
*Attorney, Agent, or Firm*—Scully, Scott, Murphy & Presser; Daniel P. Morris, Esq.

[57] ABSTRACT

The present invention is directed to a wiring layer which has high thermal stability and a better stress migration resistance characteristic as an electrode wiring material that is used in a liquid crystal display and where there is no defect such as a hillock and the like and the electric resistance is considerably low. More specifically, the present invention is directed to a wiring layer which comprises at least two layers formed on a substrate. The two layers include: a first layer which has substantially aluminum for its main component and a second layer formed on the first layer which has substantially the same component as the first layer. Also, the second layer is higher in electric resistance than the first layer and has an amorphous phase for its main phase. The second layer may also include microcrystals which have a crystal particle diameter $D_2$ smaller than a crystal particle diameter $D_1$ of the first layer.

10 Claims, 3 Drawing Sheets

WIRING LAYER AND METHOD OF FORMING THE WIRING LAYER

BACKGROUND OF THE INVENTION

1. Technical Field

The present invention relates to an electrode structure which has low resistance and high thermal stability as an electrode wiring material for liquid crystal displays and where an occurrence of stress migrations such as hillocks and whiskers is completely suppressed, and also relates to a method of forming the electrode structure.

2. Prior Art

Pure metal, such as Cu, Al, Mo, Ta, and W, or alloy material, such as Al—Cu, Al—Cu—Si, Al—Pd, has hitherto been employed in the low- resistance electrode wiring material that is employed in semiconductor devices. On the other hand, particularly in the electrode material for liquid crystal displays which have been attracting attention as flat panel displays, there have recently been required better characteristics than before, such as large area wiring for large screens, high integrated wiring for high fineness, and array formation which is the film formation onto a glass substrate. In FIG. 1 there is shown a schematic diagram of one pixel section of the array of a liquid crystal display which has a thin-film transistor (TFT) as an active device. A display electrode 2, a gate line 3, a gate electrode 3A, a data line 4, a drain electrode 4A, a source electrode 5, and an active TFT device 6 are disposed on a single pixel opening portion 1. If the TFT is turned on by a signal on the gate line 3, an electric potential on the data line 4 will become equal to the pixel electrode 2 connected through the source electrode 5. As a consequence, the liquid crystal, enclosed in the upper portion of the pixel electrode 2 in the paper surface direction, is oriented and the pixel is caused to be in a display state. Here, the electrode wiring materials for the array of a liquid crystal display, which are the objective of the present invention, are the gate line 3, the gate electrode 3A, the data line 4, the drain electrode 4A, and the source electrode 5.

The first required characteristic of the electrode wiring material for liquid crystal displays is that the electric resistance is low. If the electric resistance is high, various problems such as signal delay and heat generation will arise when the liquid crystal display is increased in its size. Pure aluminum with low electric resistance has often been employed as the wiring material for liquid crystal displays. Pure aluminum has a better etching characteristic and is also a suitable material from the standpoint of adhesion with respect to a substrate. However, pure aluminum has the disadvantage that the melting point is low and it will easily give rise to defects, called hillocks or whiskers, by a thermal process using chemical vapor disposition (CVD) after formation of a wiring film. This thermal process is usually carried out at a temperature of 300 to 400° C. If the wiring material is observed by scanning electron microscope after this process, there are cases where very small protrusions or bar-shaped crystal growth will be observed on the surface.

An example of defects such as this is shown in FIG. 2. Shown in FIG. 2 is a wiring layer 20 formed on a glass plate 17. In general, a wiring layer is composed of pure aluminum (Al) or the alloy and constituted by some crystal particles 21 through 26. Here, a portion 30 extending long in the form of a whisker from the crystal particle 22 is called a whisker, and a portion 40 bulged from the crystal particle 24 is called a hillock. If the whisker 30 or the hillock 40 (hereinafter referred to as a hillock and the like) occurs, the smoothness of the wiring material layer will be lost, and a nitride film and an oxide film, which will be formed on the wiring material layer after a subsequent process, will be formed on and along the unevenness of the underlying material. Therefore, if formation of these insulating layers is not sufficient, a problem such as an interlayer short circuit will arise between an electrode which is formed on an overlying layer and an electrode which is formed on an underlying layer. For this reason, an occurrence of the hillock and the like will become an extremely large problem in the process of fabricating liquid crystal displays. The mechanism of occurrence of the hillock and the like has not yet been fully proved, but it is considered that when compressive stress is applied to a thin film due to a difference in linear expansion coefficient between a heated film and a substrate, Al atoms will move along a grain boundary by help of this compressive stress (drive force), to cause the hillock and the like being produced.

If high-melting point metal, such as Cr, Ti, Ta, and MoTa, is used in wiring material, an occurrence of the hillock and the like can be prevented because an occurrence of atom diffusion along a grain boundary is difficult. However, these high-melting point metals are wiring materials which do not meet the tendency that a liquid crystal display is increased in size, because many of the specific resistances are high like more than 50 $\mu\Omega$ cm (about 3 $\mu\Omega$ cm for aluminum).

Hence, the development of Al-based alloys have been attempted for the electrode material. Formerly Al—Cu and Al—Cu—Si were reported and recently Al—Ta and Al—Zr were reported. However, if an electrode is formed by a single layer, an occurrence rate of the hillock and the like at a high temperature of more than 300° C. remains unsatisfactory at both surfaces of the electric resistance. To enhance resistance to thermal stress, the rate of the metal added to aluminum needs to be increased, but, on the other hand, the low-resistance characteristic will be lost and target fabrication will become difficult. For reasons such as this, a single layer of Al alloy is difficult to use, so an Al alloy with the reduced content of additional metal is used with a stacked or sandwiched structure with another metal. In this case a target for film formation of the other metal and a film formation processing room are needed.

SUMMARY OF THE INVENTION

A first object of the present invention is to provide a wiring layer which has high thermal stability and a better stress migration resistant characteristic as an electrode wiring material, particularly an electrode wiring material that is used in liquid crystal displays, and where there is no defect such as a hillock and the like and electric resistance is considerably low.

A second object of the present invention is to provide a method of forming a single thin film of Al alloy without a stacked structure with a thin film of another metal, while the aforementioned characteristics, high thermal stability, a reduced occurrence of defect such as a hillock and the like, and low electric resistance, being equipped.

The aforementioned objectives of the present invention can be solved by providing a wiring layer which comprises at least two layers formed on a substrate. The two layers comprises a first layer which has substantially aluminum for its main component and a second layer. The second layer is formed on the first layer and has substantially the same component as the first layer. Also, the second layer has electric resistance larger than that of the first layer and composed mainly of an amorphous phase. The second layer may also include microcrystals which have a crystal particle diameter $D_2$ smaller than a crystal particle diameter $D_1$ of the first layer.

A preferable additive element is copper (Cu). By reducing the Cu content to less than 3.0 weight %, the wiring layer can be formed so that the electric resistance is between 3.0 $\mu\Omega$ cm and 5.0 $\mu\Omega$ cm, which is a sufficiently low resistance required of the wiring layer.

In addition, the wiring layer according to the present invention may further have a third layer which is formed under the first layer and substantially constituted by crystals having a crystal particle diameter $D_3$ smaller than the crystal particle diameter $D_1$ of the first layer.

BRIEF DESCRIPTION OF THE DRAWINGS

Preferred embodiments of the present invention will now be described, by way of example only, with reference to the accompanying drawings, in which.

DETAILED DESCRIPTION OF THE PREFERRED EMBODIMENTS OF THE INVENTION

Figure 1:
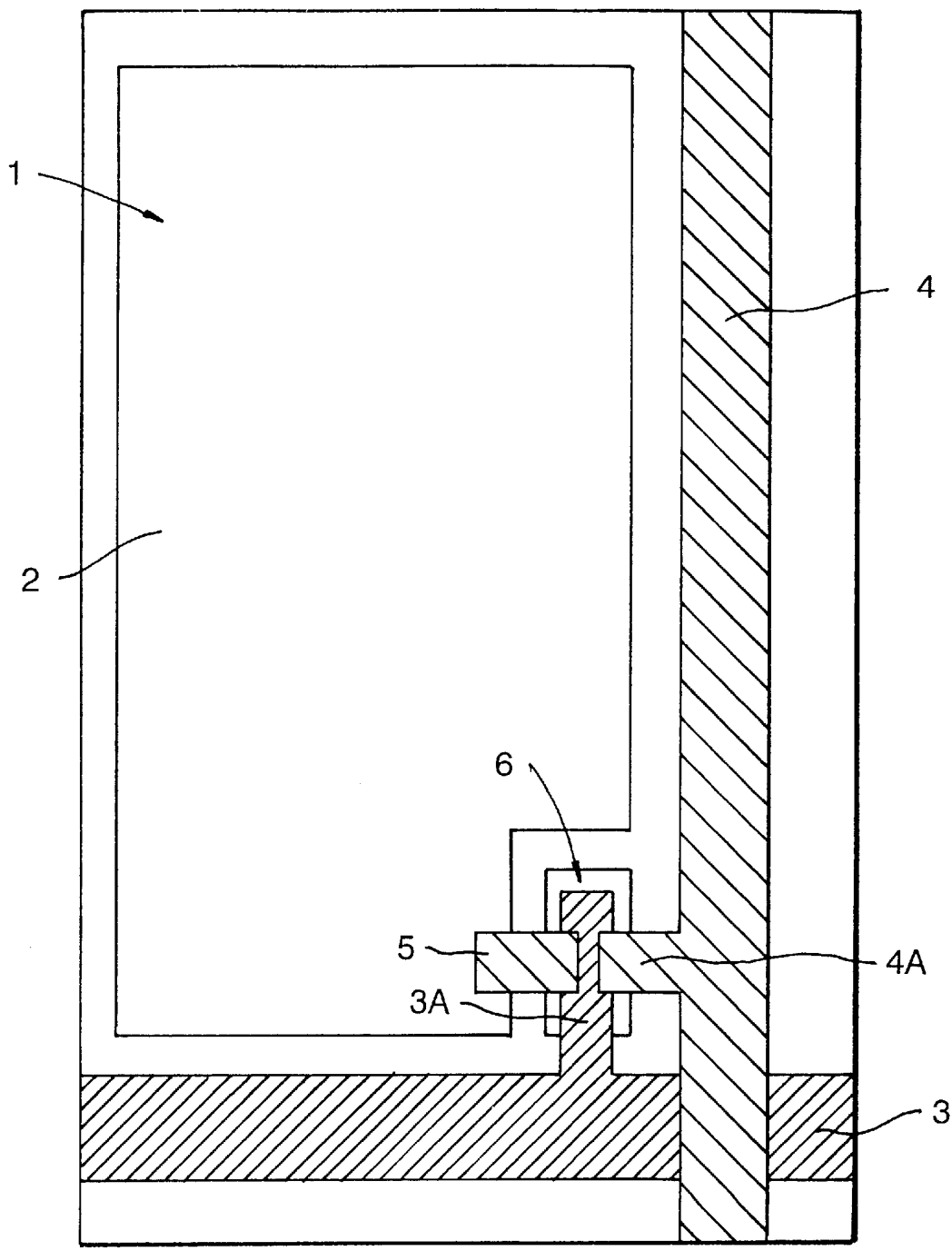
FIG. 1 is a plan view of a pixel section on the array side of a liquid crystal display with a thin-film transistor.
Figure 2:
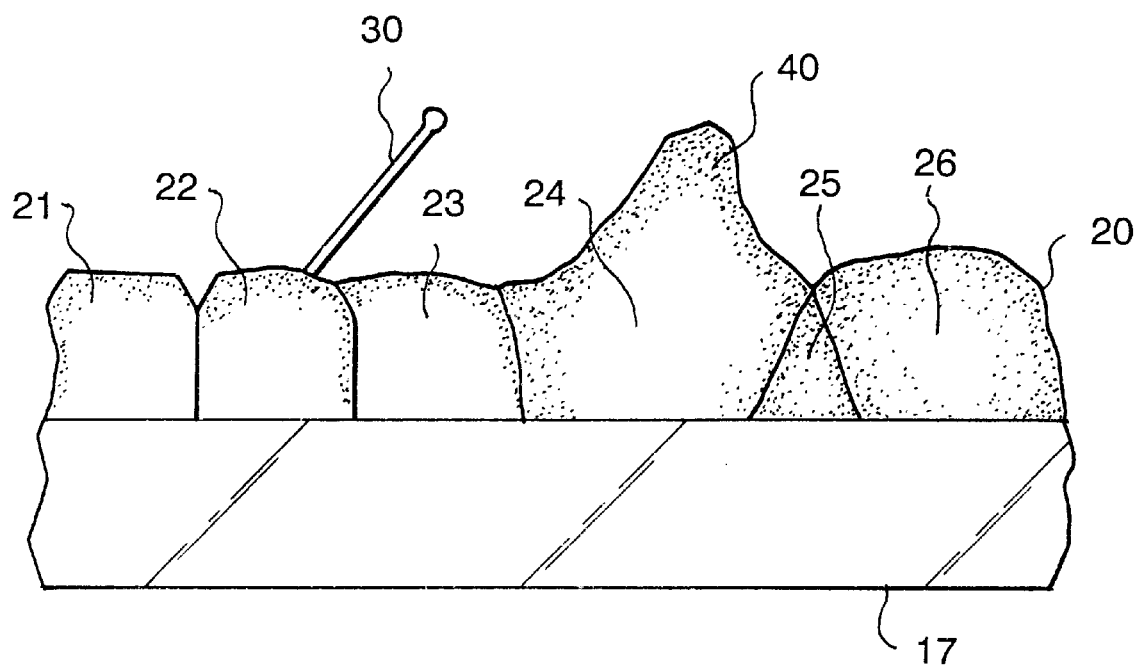
FIG. 2 is a diagram showing an example of a typical surface defect which occurs in an aluminum (Al) wiring layer.

In the present invention, a stacked structure with a plurality of stacked metal layers having substantially the same composition is formed by using aluminum (Al) as a base and adding Cu and the like as additive elements, to satisfy aforementioned characteristics. In general, if an additive element is added to aluminum (Al), the electric resistance tends to increase. Particularly when an additional element is fused into an aluminum (Al) base, this tendency becomes intense. Therefore, investigations were made in quest of elements which can improve a resistance to thermal stress by a very small quantity of addition and prevent an occurrence of defects such as hillocks and the like, and at the same time, attempts were made to form a stacked structure by the same materials, the same processing room, and continuous discharging and to form a wiring structure with a strong resistance to stress migration and low electric resistance.

The principles of the present invention are derived from the cause of occurrence of the hillock and the like. That is, as described above, it has been considered that the hillock and the like will occur due to aluminum (Al) atoms which are moved along a grain boundary by the compression stress produced by a difference in linear expansion coefficient between a heated film and a substrate. The feature of the conventional method of solution by a high-melting point metal element addition type of alloy resides rather in that the growth of crystal particles by the diffusion of aluminum (Al) atoms along a grain boundary is suppressed by the precipitation of an metal-to-metal compound between these additional elements and aluminum (Al). However, the present invention changes the viewpoint of such a method of solution and prevents the growth of crystal particles onto a surface, which becomes causative of the hillock and the like, by disposing a layer having a function of suppressing crystal growth (which will hereinafter be referred to as a suppression layer) on the uppermost layer of a wiring layer in order to prevent an occurrence of the hillock and the like.

This suppression layer is typically an amorphous layer. The term "amorphous" means a noncrystalline state, that is, a state where there is no regulation in the atom array of the interior of a substance. Since the suppression layer is in a state such mentioned, there is no crystal particle which becomes a core of crystal growth. The crystal growth which becomes causative of the hillock and the like, produced in a underlying layer (hereinafter referred to as a conductive layer) of the suppression layer, does not propagate through the suppression layer, and it becomes possible to effectively prevent an occurrence of the hillock and the like. This is because, even if such a small crystal grew, there would be no growth enough to cause an occurrence of the hillock and the like, because high-temperature environment under which the hillock and the like occur is limited to a relatively shorter period of time in a fabrication process.

The present invention will be described as the following embodiment, together with a specific thin-film formation process.

Figure 3:
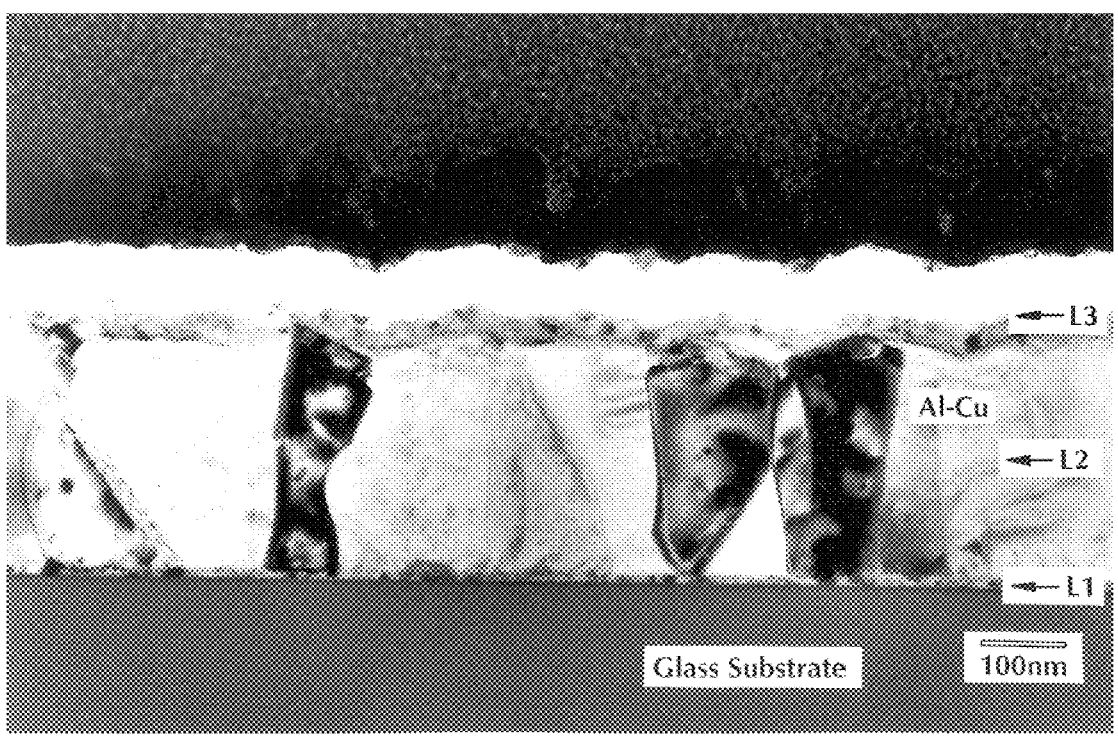
FIG. 3 is a sectional photograph (taken by a transmission type electron microscope) showing a three-layer crystal structure of an embodiment of the present invention.

A thin film of Al—Cu alloy was continuously formed at the same processing room. As a consequence, as shown in FIG. 3 (attached sectional photograph), there was obtained a three-layer structure constituted by an extra thin fine lower layer (L1) with a polycrystalline structure having a crystal particle diameter of 10 to 20 nm which prevents the influence of a base and enhances the adhesive force between an intervening layer and the base, an intervening layer (L2) with a polycrystalline structure having a crystal particle diameter of 50 to 100 nm which has a low electric resistance characteristic and bears the role of current conduction as a wiring material, and an upper layer (L3) with a structure where microcrystals are scattered in an amorphous layer which plays the role of a cover in preventing an occurrence of the hillock and the like. Here, in order to effectively prevent the hillock and the like and assure conduction needed as a wiring layer, it is necessary from the principles of the present invention that at least the intervening layer (L2) and the upper layer (L3) are provided.

The operational effects of these layers will be described.

The upper layer (L3) operates as the aforementioned suppression layer. From the aforementioned principles it is preferable that the upper layer be constituted by an amorphous phase. However, from the viewpoint of fabrication it is very difficult to constitute the upper layer (L3) by a single amorphous phase, while the necessity is little from the viewpoint of preventing an occurrence of the hillock and the like. Therefore, mixed microcrystals are allowed as shown in FIG. 3. The microcrystal is referred to as one where the particle diameter is less than 20 nm and where sufficient particle growth, which becomes causative of an occurrence of the hillock and the like, does not occur in a high-temperature process because of a microcrystal. In FIG. 3 an amorphous phase is represented as a white sponge-shaped phase, and scattered black point phases are microcrystals. Note that from the viewpoint of design the composition of the upper layer (L3) is substantially identical with those of the intervening layer (L2) and the lower layer (L1), however, since the film formation conditions are varied, there are cases where a non-metal element such as oxygen and nitrogen is slightly mixed as a result. However, even in this case the expected advantages of the present invention can be achieved.

The intervening layer (L2) operates as the aforementioned conductive layer and exclusively assures conduction as a wiring layer. The intervening layer consists of relatively rough crystal particles such as occupying the wiring layer in the thickness direction.

The lower layer (L1) is not the essential constitutional element of the present invention. However, because of the presence of the lower layer (L1), prevention of the diffusion of contamination from the glass base substrate and the adhesion with the glass plate can be assured. Therefore, it is considered that the lower layer has no relation with prevention of the hillock and the like, however the lower layer can enhance the quality of the wiring layer formed on the glass substrate.

The fabrication conditions for the wiring layer are as follows. Films are formed by employing an Al—Cu alloy target (Cu content percentage, 0.2 weight %), reducing a target cooling water quantity to about ⅓ of an ordinary film formation condition, and raising the target surface temperature to more than 18° C. on the average. Film formation making power is taken to be 44 kW and film formation pressure is taken to be 0.7 Pa. A DC magnetron type sputtering device was used as the film formation device. The bar magnet equipped in this sputtering device was reciprocated 10 or 11 times in order to form a film of thickness 350 nm. In the experiment of pure aluminum (Al) the three-layer structure film of the present invention is not obtained even under the aforementioned film formation conditions.

What is important in obtaining a wiring layer consisting of a structure such as this is like a change in the cooling water quantity. Because an amorphous layer can be generally generated by rapid heating and rapid cooling, it becomes possible to form an amorphous layer only in a portion near the surface of a wiring layer by adopting fabrication conditions such as described above.

Note that since in the present invention there is no possibility that the composition itself of a wiring layer is changed, it is possible to form films continuously in the same chamber. This point is a considerable advantage in a fabrication process. This is because, in general, the change of a chamber results in an increase in the fabrication cost and also a reduction in quality due to the oxidation of a wiring layer surface and additional labor to clean a chamber are induced. However, it is not an essential matter of the present invention to continuously form films in the same chamber.

In Table 1 there are shown the numbers of hillocks and whiskers and the grain size after the thermal processing of the fabricated thin film of Al—Cu alloy at a temperature of 300° C. under a vacuum of $2 \times 10^{-5}$ Torr for one hour. For the measurement of the numbers of generated hillocks and whiskers, impressions are applied beforehand on a thin film at 10 places by a Vickers hardness tester and the hillocks and whiskers around the impressions were counted. In table there are also shown the results of pure aluminum (Al) and Al—Cu based on a conventional method for comparison.

TABLE 1

| Sample | Number of hillocks | Number of whiskers | Grain size (nm) |
| --- | --- | --- | --- |
| Embodiment, Al—Cu | 0 | 0 | 50 to 100 |
| Comparison example, pure Al | 39 | 3 | 330 to 500 |
| Comparison example, Al—Cu | 15 | 0 | 150 to 300 |

As evident in Table 1, it is found that the thin film of Al—Cu alloy of the present invention has high thermal stability and high reliability where there are no hillock and whisker defects and is an optimum alloy and layer structure as an electron wiring material for liquid crystal displays. The grain size is sufficiently fine as compared with the two conventional methods, and when the electric resistance after heating was also measured, a value (3.0 to 3.5 $\mu\Omega$ cm) when the film is formed was obtained.

As described above, it becomes possible to effectively prevent the hillock defect in accordance with the present invention. It is assumed that the principles have no direct relation with the composition of the wiring layer. Therefore, if a wiring layer has aluminum (Al) for its main component, the same advantages could be obtained even if an element other than Cu were employed as an additional element. In general, it is considered that, as examples of these additional elements, there are Cr, Ti, Ta, MoTa, etc. Also, if, among rare earth elements such as Y, La, Nd, Gd, Dy, Pr, Sm, Ho, and Er disclosed in Japanese Patent Application No. 7-210560, at least one kind is employed as an additional element, it will be considered that the hillock resistance can be further enhanced. The same may be said of a combination of these rare earth elements and Cu. In this case the electric resistance becomes higher than that of pure aluminum (Al), however, if the resistance is less than 5 $\mu\Omega$ cm, there will be no functional problem of the wiring layer of a liquid crystal display.

Therefore, the points required as material for the wiring layer according to the present invention are as follows. First, electric resistance needs to be sufficiently low. As described before, this requirement is merely the precondition of the present invention. In general, it is preferable that the electric resistance of the wiring layer be less than 5 $\mu\Omega$ cm for the wiring application of liquid crystal displays. Depending upon applications, electric resistance higher than this can also be utilized. The second requirement is that an amorphous phase is easy to form as a main phase. The present invention prevents an occurrence of the hillock and the like by forming a portion, where an amorphous phase is a main phase, on the entire surface of the wiring layer. Therefore, this condition becomes essential for the present invention. Third, dry etching must be easy in order to form wiring patterns. For this reason, it is preferable that a concentration of Cu be less than 3 weight % for an Al—Cu alloy.

While the wiring material and wiring structure for liquid crystal displays have been described in the present specification for reasons of explanation, the wiring material and wiring structure according to the present invention can also be used in other applications which have the similar required characteristic that (1) electric resistance is low and (2) defects such as a hillock should not occur due to high temperature. Therefore, the present invention is applicable, for example, to the wiring material and wiring structure for semiconductor devices.

There can be formed a wiring layer where there is no occurrence of the hillock and the like against a thermal stress of about 300° C. and which has high reliability and a low resistance of 3.0 to 5.0 $\mu\Omega$ cm near to a pure aluminum (Al) material. For this reason, the present invention is applicable to an electrode wiring material with low resistance and high reliability which will be required of future large and high-fine liquid crystal displays. In addition, since the aforementioned advantages can be derived by a film whose impurity concentration is low like this, the present invention can readily cope with an increased size of a sputtering target which is increased as the size of substrate is increased, and the processing cost can be considerably reduced.

While the invention has been particularly shown and described with respect to preferred embodiments thereof, it will be understood by those skilled in the art that the foregoing and other changes in form and details may be made therein without departing form the spirit and scope of the invention.

Having thus described our invention, what we claim as new, and desire to secure by Letters Patent is:

1. A wiring layer comprising at least two layers formed on a substrate, wherein said at least two layers comprise (a) first layer having substantially aluminum for its main component; and (b) a second layer formed on said first layer, having substantially the same component as said first layer, said second layer having electric resistance larger than that of said first layer, and composed mainly of an amorphous phase.

2. The wiring layer according to claim 1, wherein said second layer includes microcrystals which have a crystal particle diameter $D_2$ smaller than a crystal particle diameter $D_1$ of said first layer.

3. The wiring layer according to claim 2, wherein the crystal particle diameter $D_2$ of said microcrystals is less than 10 nm.

4. The wiring layer according to claim 1, which contains copper (Cu) as an additional element.

5. The wiring layer according to claim 4, wherein the content of said copper (Cu) is less than 3.0 weight %.

6. The wiring layer according to claim 1, wherein electric resistance is less than 5.0 $\mu\Omega$ cm.

7. The wiring layer according to claim 1, further comprising a third layer that is formed under said first layer and substantially constituted by crystals having a crystal particle diameter $D_3$ smaller than the crystal particle diameter $D_1$ of said first layer.

8. The wiring layer according to claim 1, which contains at least one kind of rare earth element as an additional element.

9. A method of forming a wiring layer which prevents an occurrence of an uneven surface in the wiring layer which is formed on a substrate and has substantially aluminum (Al) for its main component, comprising the steps of:

(a) forming a first layer of said wiring layer on said substrate; and (b) forming a surface layer, on approximately the entire surface of said first layer, said surface layer having electrical resistance larger than that of said first layer, approximately the same component as said first layer and mainly composed of an amorphous phase.

10. In a method of preventing an occurrence of an uneven surface in a wiring layer which is formed on a substrate and has substantially aluminum (Al) for its main component, the method wherein a surface layer, which has substantially the same composition as said wiring layer and larger electrical resistance than that of said wiring layer, and has a phase where there is substantially no crystal growth, is formed on said wiring layer so that crystal growth from said wiring layer to said surface layer is suppressed in order to prevent the occurrence of an uneven surface.

* * * * *